(12) United States Patent
Lee

(10) Patent No.: US 7,799,675 B2
(45) Date of Patent: Sep. 21, 2010

(54) BONDED SEMICONDUCTOR STRUCTURE AND METHOD OF FABRICATING THE SAME

(76) Inventor: Sang-Yun Lee, 17082 NW. Elk Run Dr., Beaverton, OR (US) 97006

( * ) Notice: Subject to any disclaimer, the term of this patent is extended or adjusted under 35 U.S.C. 154(b) by 0 days.

(21) Appl. No.: 12/475,294

(22) Filed: May 29, 2009

(65) Prior Publication Data

US 2009/0325343 A1    Dec. 31, 2009

Related U.S. Application Data

(63) Continuation-in-part of application No. 12/040,642, filed on Feb. 29, 2008, and a continuation-in-part of application No. 11/092,498, filed on Mar. 29, 2005, now Pat. No. 7,470,142, and a continuation-in-part of application No. 11/092,499, filed on Mar. 29, 2005, now Pat. No. 7,470,598, and a continuation-in-part of application No. 11/092,500, filed on Mar. 29, 2005, and a continuation-in-part of application No. 11/092, 501, filed on Mar. 29, 2005, and a continuation-in-part of application No. 11/092,521, filed on Mar. 29, 2005, now Pat. No. 7,633,162, and a continuation-in-part of application No. 11/180,286, filed on Jul. 12, 2005, and a continuation-in-part of application No. 11/378,059, filed on Mar. 17, 2006, and a continuation-in-part of application No. 11/606,523, filed on Nov. 30, 2006, and a continuation-in-part of application No. 10/873, 969, filed on Jun. 21, 2004, now Pat. No. 7,052,941, and a continuation-in-part of application No. 11/873, 719, filed on Oct. 17, 2007, and a continuation-in-part of application No. 11/873,851, filed on Oct. 17, 2007, now Pat. No. 7,718,508, and a continuation-in-part of application No. 11/873,769, filed on Oct. 17, 2007.

(30) Foreign Application Priority Data

| Jun. 24, 2003 | (KR) | ............ 10-2003-0040920 |
| Jul. 12, 2003 | (KR) | ............ 10-2003-0047515 |
| May 21, 2008 | (KR) | ............ 10-2008-0046991 |

(51) Int. Cl.
*H01L 21/4763* (2006.01)
(52) U.S. Cl. .................. 438/637; 438/455; 438/618; 257/E23.145
(58) Field of Classification Search .......... 438/618, 438/637; 257/E23.145, E23.151, E21.577
See application file for complete search history.

(56) References Cited

U.S. PATENT DOCUMENTS

| 4,704,785 A | 11/1987 | Curran |
| 4,829,018 A | 5/1989 | Wahlstrom |
| 4,939,568 A | 7/1990 | Kato et al. |

(Continued)

*Primary Examiner*—Thao P. Le
(74) *Attorney, Agent, or Firm*—Schmeiser Olsen & Watts LLP

(57) ABSTRACT

A method of forming a bonded semiconductor structure circuit includes providing a support substrate which carries a first semiconductor circuit and providing a first interconnect region carried by the support substrate. The method includes providing a bonded semiconductor substrate which is bonded to the first interconnect region through a bonding interface and forming a second semiconductor circuit which is carried by the first bonded semiconductor substrate.

19 Claims, 10 Drawing Sheets

U.S. PATENT DOCUMENTS

| | | |
|---|---|---|
| 5,047,979 A | 9/1991 | Leung |
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,265,047 A | 11/1993 | Leung et al. |
| 5,266,511 A | 11/1993 | Takao |
| 5,308,782 A | 5/1994 | Mazure et al. |
| 5,355,022 A | 10/1994 | Sugahara et al. |
| 5,374,564 A | 12/1994 | Bruel |
| 5,554,870 A | 9/1996 | Fitch et al. |
| 5,627,106 A | 5/1997 | Hsu |
| 5,695,557 A | 12/1997 | Yamagata et al. |
| 5,737,748 A | 4/1998 | Shigeeda |
| 5,829,026 A | 10/1998 | Leung et al. |
| 5,835,396 A | 11/1998 | Zhang |
| 5,892,225 A | 4/1999 | Okihara |
| 5,915,167 A | 6/1999 | Leedy |
| 5,977,579 A | 11/1999 | Noble |
| 5,980,633 A | 11/1999 | Yamagata et al. |
| 5,998,808 A | 12/1999 | Matsushita |
| 6,009,496 A | 12/1999 | Tsai |
| 6,153,495 A | 11/2000 | Kub et al. |
| 6,222,251 B1 | 4/2001 | Holloway |
| 6,229,161 B1 | 5/2001 | Nemati et al. |
| 6,259,623 B1 | 7/2001 | Takahashi |
| 6,331,468 B1 | 12/2001 | Aronowitz et al. |
| 6,380,099 B2 | 4/2002 | Sakaguchi et al. |
| 6,531,697 B1 | 3/2003 | Nakamura et al. |
| 6,534,382 B1 | 3/2003 | Sakaguchi et al. |
| 6,535,411 B2 | 3/2003 | Jolin et al. |
| 6,600,173 B2 | 7/2003 | Tiwari |
| 6,621,168 B2 | 9/2003 | Sundahl et al. |
| 6,630,713 B2 | 10/2003 | Geusic |
| 6,677,204 B2 | 1/2004 | Cleeves et al. |
| 6,742,067 B2 | 5/2004 | Hsien |
| 6,751,113 B2 | 6/2004 | Bhakta et al. |
| 6,787,920 B2 | 9/2004 | Amir |
| 6,822,233 B2 | 11/2004 | Nakamura et al. |
| 6,854,067 B1 | 2/2005 | Kutz et al. |
| 6,943,067 B2 * | 9/2005 | Greenlaw .................. 438/152 |
| 6,943,407 B2 | 9/2005 | Ouyang et al. |
| 6,995,430 B2 | 2/2006 | Langdo et al. |
| 7,002,152 B2 | 2/2006 | Grunewald |
| 7,078,739 B1 | 7/2006 | Nemati et al. |
| 7,470,142 B2 | 12/2008 | Lee |
| 7,470,598 B2 | 12/2008 | Lee |
| 7,534,718 B2 * | 5/2009 | Lin et al. .................. 438/623 |
| 2002/0024140 A1 * | 2/2002 | Nakajima et al. .......... 257/758 |
| 2002/0025604 A1 | 2/2002 | Tiwari |
| 2002/0141233 A1 | 10/2002 | Hosotani et al. |
| 2003/0067043 A1 | 4/2003 | Zhang |
| 2003/0113963 A1 | 6/2003 | Wurzer |
| 2003/0139011 A1 | 7/2003 | Cleeves et al. |
| 2004/0113207 A1 | 6/2004 | Hsu et al. |
| 2004/0131233 A1 | 7/2004 | Comaniciu et al. |
| 2004/0155301 A1 | 8/2004 | Zhang |
| 2004/0156233 A1 | 8/2004 | Bhattacharyya |
| 2004/0160849 A1 | 8/2004 | Rinerson et al. |

* cited by examiner

BONDED SEMICONDUCTOR STRUCTURE AND METHOD OF FABRICATING THE SAME

CROSS-REFERENCE TO RELATED APPLICATIONS

This application claims the benefit of Korean Patent Application No. 10-2008-50946, filed on May 30, 2008, the contents of which are incorporated herein by reference.

This application is a continuation-in-part of, and claims the benefit of, U.S. patent application Ser. No. 12/470,344, which claims the benefit of Republic of Korea Patent Application No. 10-2008-0046991, the contents of which are incorporated herein by reference.

This application is a continuation-in-part of, and claims the benefit of, U.S. patent application Ser. No.:

12/040,642, filed on Feb. 29, 2008,

Ser. No. 11/092,498, filed on Mar. 29, 2005, now U.S. Pat. No. 7,470,142,

Ser. No. 11/092,499, filed on Mar. 29, 2005, now U.S. Pat. No. 7,470,598,

Ser. No. 11/092,500, filed on Mar. 29, 2005,

Ser. No. 11/092,501, filed on Mar. 29, 2005;

Ser. No. 11/092,521, filed on Mar. 29, 2005;

Ser. No. 11/180,286, filed on Jul. 12, 2005;

Ser. No. 11/378,059, filed on Mar. 17, 2006; and

Ser. No. 11/606,523, filed on Nov. 30, 2006;

which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated herein by reference in their entirety.

This is also a continuation-in-part of, and claims the benefit of, U.S. patent application No.:

11/873,719, filed on Oct. 17, 2007; and

Ser. NO. 11/873,851, filed on Oct. 17, 2007;

which in turn are divisionals of, and claim the benefit of, U.S. patent application Ser. No. 10/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

This is also a continuation-in-part of, and claims the benefit of, U.S. patent application Ser. No. 11/873,769, filed on Oct. 17, 2007, which in turn is a divisional of, and claims the benefit of, U.S. patent application Ser. No. 10/092,500, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

BACKGROUND OF THE INVENTION

1. Field of the Invention

This invention relates to bonded semiconductor structures formed using bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. No. 6,600,173 to Tiwari, U.S. Pat No. 6,222,251 to Holloway and U.S. Pat. No. 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. No. 5,106,775 to Kaga, U.S. Pat. No. 6,229,161 to Nemati and U.S. Pat No. 7,078,739 to Nemati.

It should be noted that U.S. Pat. No. 5,554,870 to Fitch, U.S. Pat. No. 6,229,161 to Nemati and U.S, Pat No. 7,078,739 to Nemati disclose the formation of both horizontal and vertical semiconductor devices on a single major surface of a substrate. However, forming both horizontal and vertical semiconductor devices on a single major surface of a substrate complicates the processing steps because the masks and processing steps needed are not compatible.

Some references disclose forming an electronic device, such as a dynamic random access memory (DRAM) capacitor, by crystallizing polycrystalline and/or amorphous semiconductor material using a laser. One such electronic device is described in U.S. patent Application No. 20040156233 to Bhattacharyya. The laser is used to heat the polycrystalline or amorphous semiconductor material to form a single crystalline semiconductor material. However, a disadvantage of this method is that the laser is capable of driving the temperature of the semiconductor material to be greater than 800 degrees Celsius (° C.). In some situations, the temperature of the semiconductor material is driven to be greater than about 1000° C. It should be noted that some of this heat undesirably flows to other regions of the semiconductor structure proximate to the DRAM capacitor, which can cause damage.

Another type of semiconductor memory is referred to as a static random access memory (SRAM) circuit. There are many different circuits that operate as SRAM memory circuits, with examples being disclosed in U.S. Pat. Nos. 5,047,979, 5,265,047 and 6,259,623. Some SRAM memory circuits include four transistors per unit cell, and others include six transistors per unit cell. In general, an SRAM memory circuit occupies more area as the number of transistors it includes increases. Hence, an SRAM memory circuit having six transistors generally occupies more area than an SRAM memory circuit having four transistors.

The transistors of many SRAM memory circuits are metal oxide field effect (MOSFET) transistors, which can be n-channel or p-channel. An n-channel MOSFET is typically referred to as an NMOS transistor and a p-channel MOSFET is typically referred to as a PMOS transistor. SRAM memory circuits are complementary metal oxide semiconductor (CMOS) circuits when they include NMOS and PMOS transistors connected together. A substrate which carries a CMOS circuit requires a p-type well and an n-type well, wherein the p-type well is used to from the NMOS transistors and the n-type well is used to form the PMOS transistors. The p-type well and n-type well are spaced apart from each other, which undesirably increases the area occupied by the CMOS circuit. Accordingly, it is highly desirable to provide an SRAM circuit which occupies less area.

BRIEF SUMMARY OF THE INVENTION

The present invention is directed to bonded semiconductor structures. The novel features of the invention are set forth with particularity in the appended claims. The invention will be best understood from the following description when read in conjunction with the accompanying drawings.

DETAILED DESCRIPTION OF THE INVENTION

Figure 1:
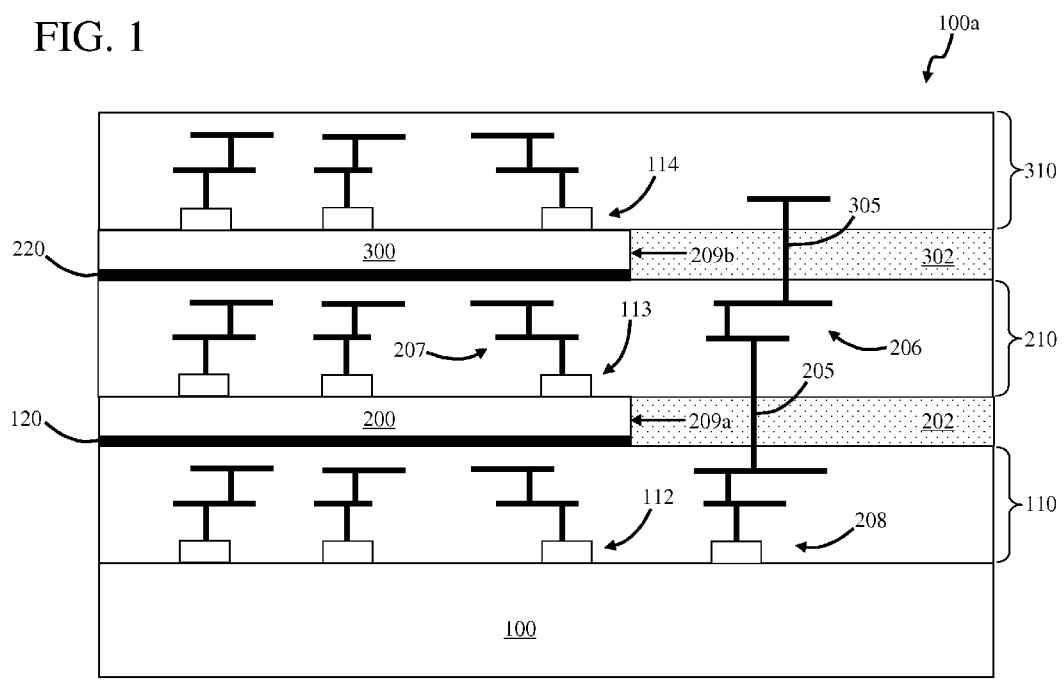
FIG. 1 is a sectional view of one embodiment of a bonded semiconductor structure circuit.

FIG. 1 is a cross-sectional view of one embodiment of a bonded semiconductor structure circuit 100a. Bonded semiconductor structure circuit 100a is a bonded semiconductor structure because, as discussed in more detail below, it includes a bonding region which bonds an electronic device to an interconnect region through a bonding interface. Other semiconductor structures are not bonded semiconductor structures because they do not include a bonding region which bonds an electronic device through a bonding interface.

In this embodiment, bonded semiconductor structure circuit 100a includes a support substrate 100 which carries an interconnect region 110 and a horizontally oriented semiconductor device 112. Horizontally oriented semiconductor device 112 is embodies as a single semiconductor device. However, it should be noted that a number of horizontally oriented semiconductor devices can be carried by support substrate 100, wherein the devices are connected together to operate as a memory circuit, such as a dynamic random access memory (DRAM) circuit, static random access memory (SRAM) circuit, phase change random access memory (PRAM) circuit and a flash memory circuit, among others. It should also be noted that horizontally oriented semiconductor device 112 can be of many different types of semiconductor devices, such as a metal oxide field effect transistor (MOSFET) and a bipolar junction transistor (BJT), among others. The number of horizontally oriented semiconductor devices can be coupled together to operate as a control circuit and a processor circuit.

In this embodiment, interconnect region 110 includes a dielectric material region which is formed on support substrate 100. The dielectric material region extends over and covers horizontally oriented semiconductor device 112. The dielectric material region forms a growth interface proximate to the surface of support substrate 100, wherein the growth interface is a dielectric-to-semiconductor growth interface because it is established between the dielectric material region of interconnect region 110 and semiconductor material of support substrate 100. The dielectric material region of interconnect region 110 can include many different types of dielectric materials, such as silicon dioxide, silicon nitride, PSG (PhosphoSilicate Glass), BPSG (BoroPhosphoSilicate Glass), USG (Undoped Silicate Glass) and PE-TEOS (Plasma Enhanced-TetraEthylOrthoSilicate Glass), among others.

Interconnect region 110 includes one or more conductive lines, which extend through the dielectric material region. The conductive lines can be of many different types, such as a via and interconnect, wherein, in this embodiment, a via extends perpendicular to an upper surface of support substrate 100 and an interconnect extends parallel to the upper surface of support substrate 100. The conductive lines are typically connected to horizontally oriented semiconductor devices 112 to allow them to communicate with each other, as well as other electronic devices, which will be discussed in more detail below. In this embodiment, a conductive line 208 is connected to horizontally oriented semiconductor devices 112 and extends upwardly therefrom.

The material of the conductive lines can be of many different types, such as aluminum and copper and refractory metals. It should be noted that the conductive lines are typically connected to a semiconductor material through a contact metal, which forms an ohmic contact. For example, the conductive lines are typically connected to a corresponding source or drain of a transistor through an ohmic contact. However, the contact metals are not shown herein for simplicity. The contact metals can be of many different types, such as tungsten (W), titanium (Ti), molybdenum (Mo), tantalum (Ta), titanium nitride (TiN), tantalum nitride (TaN), zirconium nitride (ZrN), tungsten nitride, and alloys thereof. Refractory metals typically have a low resistivity, low stress, superior step coverage and superior thermal expansion coefficient, and are less affected by being exposed to high temperatures, such as temperatures above about 700 degrees Celsius (° C.). Due to these advantages, the electrical performance and reliability of interconnect region 110 can be maintained.

In this embodiment, a bonded semiconductor substrate 200 is bonded to interconnect region 110. Bonded semiconductor substrate 200 can be bonded to interconnect region 110 in many different ways. In this embodiment, bonded semiconductor substrate 200 is bonded to interconnect region 110 by forming a bonding layer 120 therebetween. It should be noted that a bonding interface is formed in response to bonding bonded semiconductor substrate 200 to interconnect region 110. More information regarding bonding, bonding layers and bonding interfaces is provided in the above-referenced related patents and patent applications.

In this embodiment, a dielectric layer 202 is formed in a predetermined region of bonded substrate 200 so that dielectric layer 202 extends adjacent to a sidewall 209a of bonded substrate 200. In particular, dielectric layer 202 is positioned so that conductive line 205 extends between it and horizontally oriented semiconductor device 112. A via 205 is formed so it extends through dielectric layer 202 and is connected to conductive line 205.

In this embodiment, a horizontally oriented semiconductor device 113 is formed so it is carried by bonded semiconductor substrate 200. Further, an interconnect region 210 is formed so that it includes a conductive line 207 connected to horizontally oriented semiconductor device 113 and a conductive line 206 connected to via 205. It should be noted that interconnect region 210 can include the same materials as interconnect region 110.

Horizontally oriented semiconductor device 113 can be the same type of device as horizontally oriented semiconductor device 112. Further, in some embodiments, support substrate 100 and bonded substrate 200 carry the same type of electronic circuit, such as a controller circuit or processor circuit. In one embodiment, support substrate 100 carries a memory device and bonded substrate 200 carries a control circuit which controls the operation of the memory circuit through signals flowed through interconnect region 110.

It should be noted that horizontally oriented semiconductor devices 112 and 113 are connected together through interconnect regions 110 and 210, which are connected together through via 205. In this way, horizontally oriented semiconductor devices 112 and 113 are in communication with each other through dielectric layer 210.

In this embodiment, a bonded semiconductor substrate 300 is bonded to interconnect region 210. Bonded semiconductor substrate 300 can be bonded to interconnect region 210 in many different ways. In this embodiment, bonded semiconductor substrate 300 is bonded to interconnect region 210 by forming a bonding layer 220 therebetween. It should be noted that a bonding interface is formed in response to bonding bonded semiconductor substrate 300 to interconnect region 210. More information regarding bonding, bonding layers and bonding interfaces is provided in the above-referenced related patents and patent applications.

It should be noted that more semiconductor substrates can be bonded so they are carried by support substrate 100. However, two semiconductor substrates are shown bonded, in this embodiment, so they are carried by support substrate 100 for illustrative purposes.

In this embodiment, a dielectric layer 302 is formed in a predetermined region of bonded substrate 300 so that dielectric layer 302 extends adjacent to a sidewall 209b of bonded substrate 300. In particular, dielectric layer 302 is positioned so that conductive line 305 extends between it and horizontally oriented semiconductor device 112. A via 305 is formed so it extends through dielectric layer 302 and is connected to conductive line 305.

In this embodiment, a horizontally oriented semiconductor device 114 is formed so it is carried by bonded semiconductor substrate 300. Further, an interconnect region 310 is formed so that it includes a conductive line 307 connected to horizontally oriented semiconductor device 114 and a conductive line 306 connected to via 305. It should be noted that interconnect region 310 can include the same materials as interconnect regions 110 and 210.

Horizontally oriented semiconductor device 114 can be the same type of device as horizontally oriented semiconductor devices 112 and 113. Further, in some embodiments, support substrate 100 and bonded substrates 200 and 300 carry the same type of electronic circuit, such as a controller circuit or processor circuit. In one embodiment, support substrate 100 carries a memory device and bonded substrate 300 carries a control circuit which controls the operation of the memory circuit through signals flowed through interconnect regions 110, 210 and 310.

It should be noted that horizontally oriented semiconductor devices 112, 113 and 114 are connected together through interconnect regions 110, 210 and 310, which are connected together through vias 205 and 305. In this way, horizontally oriented semiconductor devices 112, 113 and 114 are in communication with each other through dielectric layers 210 and 310.

In one particular embodiment, support substrate 100 carries volatile memory circuitry, bonded substrate 200 carries non-volatile memory circuitry, and bonded substrate 200 carries control circuitry which controls the operation of the volatile and non-volatile memory circuitry carried by support substrate 100 and bonded substrate 200, respectively.

In another particular embodiment, bonded substrates 100 and 200 carry semiconductor devices that are connected together to operate as a semiconductor circuit, and support substrate 300 carries logic circuitry which controls the operation of the semiconductor circuit. For example, the semiconductor circuit can operate as a six transistor SRAM circuit, wherein support substrate 100 carries four transistors of the SRAM circuit and bonded substrate 200 carries two transistors of the SRAM circuit.

It should be noted that there are several advantages provided by bonded semiconductor structure circuit 100a. For example, the electrical performance and reliability of the circuits carried by support substrate 100 and bonded substrate 200 can be protected from high process temperature during the formation of the circuitry carried by bonded substrate 300.

Specifically, when a memory cell is formed with support substrate 100 or bonded substrate 200, and the logic cell is formed with bonded substrate 300, the memory cell can be electrically connected by refractory metal interconnects which have relatively higher sheet resistivity, and the logic cell can be electrically connected using copper (Cu) or aluminum (Al) so that the interconnect regions can be formed at relatively lower temperature (below about 400° C.), and the logic cell can be operated in a higher speed.

Figure 2:
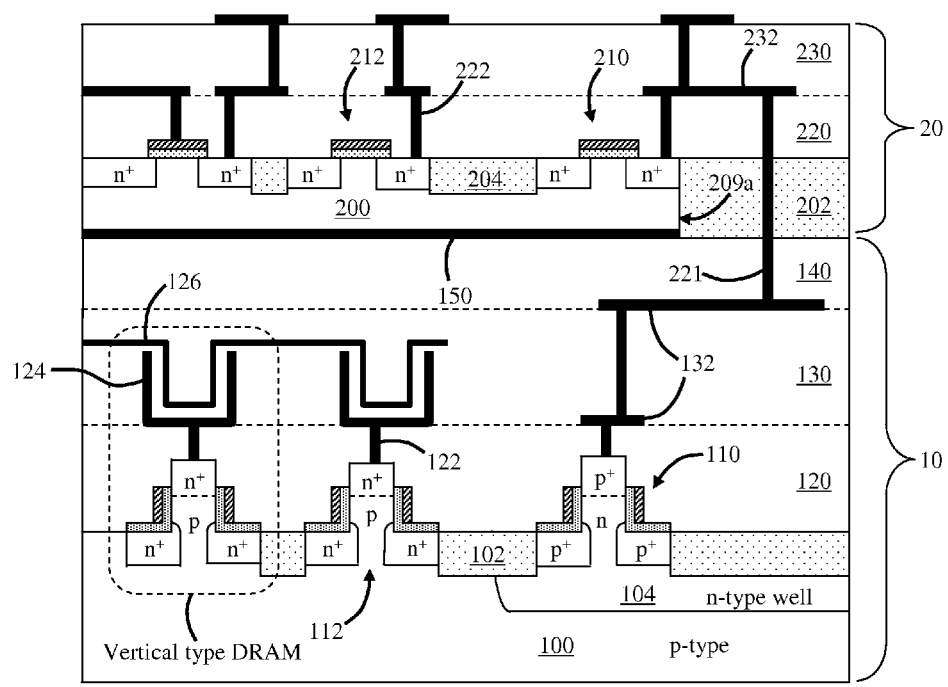
FIG. 2 is a sectional view of another embodiment of a bonded semiconductor structure circuit.

FIG. 2 is a sectional view of another embodiment of a semiconductor device in accordance with present invention.

In this embodiment, a DRAM (Dynamic Random Access Memory) device which is a volatile memory circuitry is formed on the first semiconductor substrate 100. It should be noted that not only DRAM device but MOSFET, logic circuit, SRAM, PRAM or Flash memory can be also formed on the first semiconductor substrate 100.

In FIG. 2, cell devices 10 of the semiconductor memory circuitry are formed on the first semiconductor substrate 100. The cell devices 10 on the first semiconductor substrate 100 are covered by interlayer dielectric layers 120, 130, 140 which is formed in multiple stack, and a bonding layer 150 is formed on the most upper dielectric layer 140. A second semiconductor substrate 200 is bonded on the bonding layer 150, and logic devices 20 of the memory device are formed on the second semiconductor substrate 200.

Specifically, as shown in FIG. 2, the first semiconductor 100 is provided which includes an active region defined by isolation 102. The isolation 102 is formed at a pre-defined depth in the first semiconductor substrate 100. And a well region 104 can be included in which n-type or p-type dopants are ion implanted in pre-defined area in the semiconductor substrate 100.

Transistors are fabricated on the active region of the semiconductor substrate 100. Specifically, gate conductors 110 are vertically formed with gate dielectric and conductor attached to the gate conductors 110, and a source/drain region 112 is formed correspondingly in where dopants are doped in the first semiconductor substrate 100.

In other words, the transistors according to present invention can be formed in vertical structure, and this gives an advantage over conventional planar transistor that it can have better chip density.

The transistors formed on the first semiconductor substrate 100 are covered with a first interlayer dielectric film 120, and contacts 122 are formed in the first interlayer dielectric film 120 and contacts 122 are electrically connected to the transistors underneath. And, capacitors 124, 126 and interconnects 132 are formed on the contacts 122 in the first interlayer dielectric film 120.

The capacitors 124, 126 in the first interlayer dielectric film 120 can be cylinder type or stack type. In this embodiment, the cylinder type will be explained.

A lower conductor 124 can be formed on the first interlayer dielectric film 120, and a dielectric film (not illustrated) and upper conductor 126 is formed conformal to the lower conductor 124. The lower conductor 124 and upper conductor 126 can be formed with poly silicon or metal, and the dielectric film (not illustrated) can be a single stacked film of Tantalum Oxide ($Ta_2O_5$) or Aluminum Oxide ($Al_2O_3$), or a stacked film of Tantalum Oxide/Titanium Oxide or Aluminum Oxide/Titanium Oxide.

A second interlayer dielectric film 130 is formed on the first interlayer dielectric film 120 to cover the capacitors 124, 126, and a upper region interconnects 132 are located on the second interlayer dielectric film 130 to be connected to the lower region interconnects 132.

In this embodiment, the contacts 122 and interconnects 132 included in the cell device of the semiconductor device are formed with refractory metal. This refractory metal can be, for example, Tungsten (W), Titanium (Ti), Molybdenum (Mo), Tantalum (Ta), Titanium Nitride (TiN), Tantalum Nitride (TaN), Zirconium Nitride (ZrN), Tungsten Nitride (WN) or alloy of combination of those metals. The refractory metal has low resistivity, low stress, superior step coverage and good thermal expansion coefficient so that material performance, characteristics and reliability are maintained at the following process steps.

As illustrated in FIG. 2, a third interlayer dielectric film 140 is formed on the second interlayer dielectric film 130 so that the third interlayer dielectric film 140 completely covers the cell devices of the semiconductor memory device. The top surface of the third interlayer dielectric film 140 is planarized.

A second semiconductor substrate 200 is bonded on the third interlayer dielectric film 140 which is most upper layer of the first semiconductor substrate 100. In this arrangement, a bonding layer 150 can be located in between the third interlayer dielectric film 140 and the second semiconductor substrate 200.

The bonding layer 150 can be photo-setting adhesive such as reaction-setting adhesive, thermal-setting adhesive, photo-setting adhesive such as UV-setting adhesive, or anaerobe adhesive. Further, the bonding layer can be, such as, metallic bond (Ti, TiN, Al), epoxy, acrylate, or silicon adhesives.

Logic circuitry 20 can be located on the second semiconductor substrate 200 which is stacked on the cell circuitry 10 of the semiconductor memory device, and this logic circuitry 20 can comprise a redundancy circuitry or error correction circuit (ECC) which can be used for replacing bad or error cells in the cell circuitry 10.

Specifically, an isolation 202 is included which is formed to be penetrated from top surface to the bottom surface in a pre-defined region of the second semiconductor substrate 200. The isolation 202 is located on the area where electrical interconnect 221 will be formed. The isolation 202 electrically isolates connect interconnect 221 which electrically connect cell circuitry in the lower part and the logic circuitry in the upper region.

Isolation 204 is formed in the second semiconductor substrate 200, and transistors 210, 212 are formed in the active region of the second semiconductor substrate 200. The transistors 210, 212 in the second semiconductor substrate 200 can comprise logic circuitry 20 of the semiconductor device. It can be noted that the transistors 210, 212 are formed as conventional planar type transistors unlike the transistors 110, 12 in the first semiconductor substrate 100.

A fourth and fifth interlayer dielectric film 220, 230 are formed on the transistors 210,212 on the second semiconductor substrate 200. The fifth interlayer dielectric film 220, 230 includes interconnects 232.

The interconnects 232 on the second semiconductor substrate 200 can be formed with metal such as Aluminum (Al) or Copper (Cu). The interconnects 232 also can be formed with refractory metal such as Titanium (Tim), Titanium Nitride (TiN) or Tungsten (W).

The interconnects 232 can be electrically connected to the interconnects 132 in the lower region through the connect interconnect 221. The interconnect 221 selectively connects interconnects 132 of the memory cell circuitry 10 and interconnects of the logic circuitry 20, through penetrating the isolation 202 of the second semiconductor substrate 200. The interconnect 221 can be formed with refractory metal which has superior characteristics under high temperature environment. By this arrangement, the memory cell circuitry 10 in the first semiconductor substrate 100 and the logic circuitry 20 in the second semiconductor substrate 100 can be electrically connected.

In this embodiment of present invention, it should be noted that 3D device which has cell circuitry 10 in the lower region and logic circuitry 20 in the upper region has advantages, which is the interconnects 232 can be formed in low temperature so that Aluminum (Al) or Copper (Cu) which has low sheet resistance can be used for metal interconnects 232.

In this embodiment, because the logic circuitry 20 can be operated at higher speed, the 3D device can be operated faster than the device which has logic circuitry in the lower region and cell circuitry in the upper region.

Figure 3:
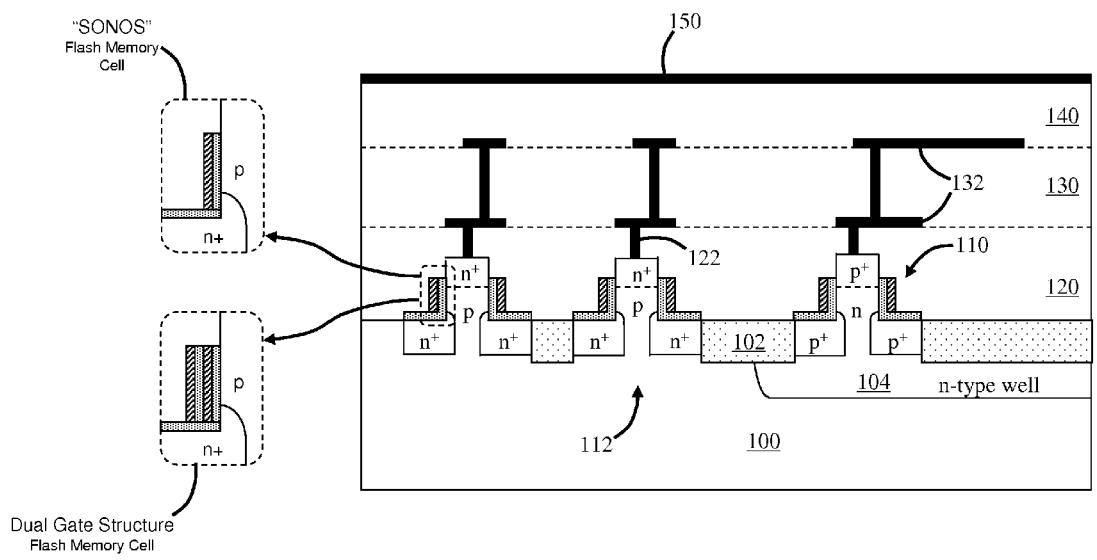
FIG. 3 is a sectional view of another embodiment of a bonded semiconductor structure circuit.

FIG. 3 is a sectional view of a semiconductor device in accordance with present invention. In this embodiment, the first microelectronic device 110 is a non-volatile memory.

In FIG. 3, when the first microelectronic device 110 comprises non-volatile memory such as Flash memory, a gate conductor of the first microelectronic device 110 can be formed as dual-gate structure or a SONOS layer structure (Silicon-Oxide-Nitride-Oxide-Silicon) structure. More information regarding devices having a dual gate U.S. Pat. Nos. 4,511,813, 6,060,361, 6,121,124, 6,207,530, 6,392,488, 6,458,662 and 6,596,597, the contents of which are incorporated by reference as though fully set forth herein. More information regarding devices having a SONOS layer structure can be found in U.S. Pat. Nos. 5,168,334, 6,440,797, 6,639,836, 6,680,509 and 6,630,784, the contents of which are incorporated by reference as though fully set forth herein.

The dual gate structure can be comprised of a control gate which is connected to the word line, a floating gate in which the charge is stored, and dielectric layer in between the word line and floating gate. In SONOS structure, the gate dielectric includes nitride so that the charge is stored in the nitride and oxide.

It should be noted that while particular embodiments of the invention have been shown and described, numerous variations and alternate embodiments will occur to those skilled in the art.

FIGS. 4 through 10 are sectional views of the semiconductor device in accordance with present invention, and the method of fabricating the same will be described.

Figure 4:
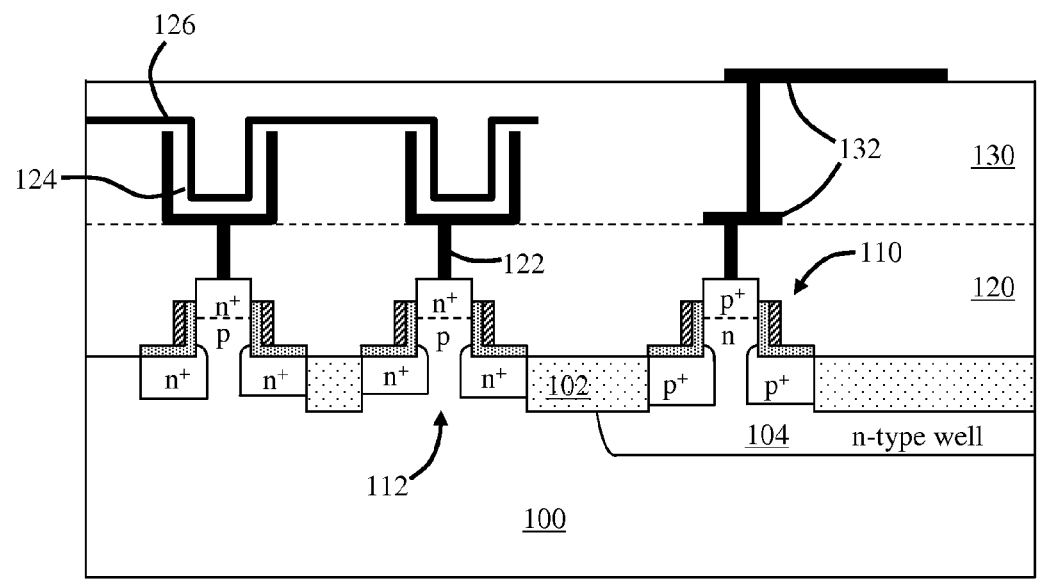
FIGS. 4 through 10 are sectional views of steps in forming a bonded semiconductor structure circuit.

In FIG. 4, vertical transistors 110, 112 are formed on a first semiconductor substrate 100, and then a first interlayer dielectric film 120 is formed by depositing a insulating film which has a good step coverage.

The method of forming the vertical transistors is described.

The first semiconductor substrate 100 is provided. The first semiconductor substrate 100 can bulk silicon substrate, bulk silicon-germanium substrate or a semiconductor substrate where a silicon or silicon-germanium epitaxial layer is formed on the bulk silicon or bulk silicon-germanium substrate. Also, the first semiconductor substrate 100 can be well known substrate to those skilled in the art such as silicon-on-sapphire (SOS), silicon-on-insulator (SOI), thin film transistor (TFT), doped or undoped semiconductors, or silicon epitaxial on a base substrate.

As a following step, well region 104 is formed in the first semiconductor substrate 100. The well region 104 can be formed by ion implanting dopants into the surface of the first semiconductor substrate 100. P-type well region in where NMOS circuitry will be formed can be formed by ion implanting such as Boron, and N-type well region in where PMOS circuitry will be formed can be formed by ion implanting such as phosphorus.

As a following step, isolation 102 is formed to define active region in the first semiconductor substrate 100. The isolation 102 can be formed by forming trench in the first semiconductor substrate 100 and filling the trench with insulating materials such as High Density Plasma (HDP) Oxide.

After this, gate conductor 110 is formed by depositing and patterning gate dielectric film and gate conductor, and then dopants are ion implanted to form source/drain region 112. This completes formation of vertical transistors 110, 112.

In the following steps, contacts 122 are formed in the first interlayer dielectric film 120, to be electrically connected to the transistors in the lower region. The contacts 122 can be formed by anisotropic etch the first interlayer dielectric film 120 to form a contact hole to expose the source/drain region 112 or the gate conductor 110, and then fill in the contact hole with conductive material.

After this, capacitors 124, 126 and interconnects 132 are formed in the first interlayer dielectric film 120. The capacitors 124, 126 are used to store data, and can be formed in many different shapes such as stack type or cylinder type. In this embodiment, method for forming cylinder type capacitor 124, 126 will be described.

Firstly, a sacrificial film for mold (not illustrated) is formed on the first interlayer dielectric film 120, a conductive film for electrode is deposited on side wall and top of the mold, and then a insulating film (not illustrated) with good gap filling characteristics is deposited. After this, the top of the mold is planarized until the sacrificial film is exposed, and then the insulating film and sacrificial film is removed to form a cylinder type lower electrode 124. A dielectric film (not illustrated) and a conductive film for upper electrode are deposited on the lower electrode 124, and then patterned to complete capacitor.

After forming the capacitors 124, 126, oxide insulating film is deposited on the whole area. After this, Chemical-Mechanical Polish (CMP) or etch back is performed to planarize the top of the third interlayer dielectric film 130.

After forming the third interlayer dielectric film 130, the third interlayer dielectric film 130 is patterned to form contacts which are vertically electrically connected to the capacitors 124, 126 in the third interlayer dielectric film 130 or interconnects 132. Then interconnects 132 are formed on the third interlayer dielectric film 130 to be connected to the contacts.

Refractory metal is used for contacts and interconnects 132 to allow less thermal affection to the lower region during the fabricating process. The contacts and interconnects 132 can be formed with Tungsten (W), Titanium (Ti), Molybdenum (Mo), Tantalum (Ta), Titanium Nitride (TiN), Tantalum Nitride (TaN), Zirconium Nitride (ZrN), Tungsten Nitride (WN) or alloy of combination of those metals.

Figure 5:
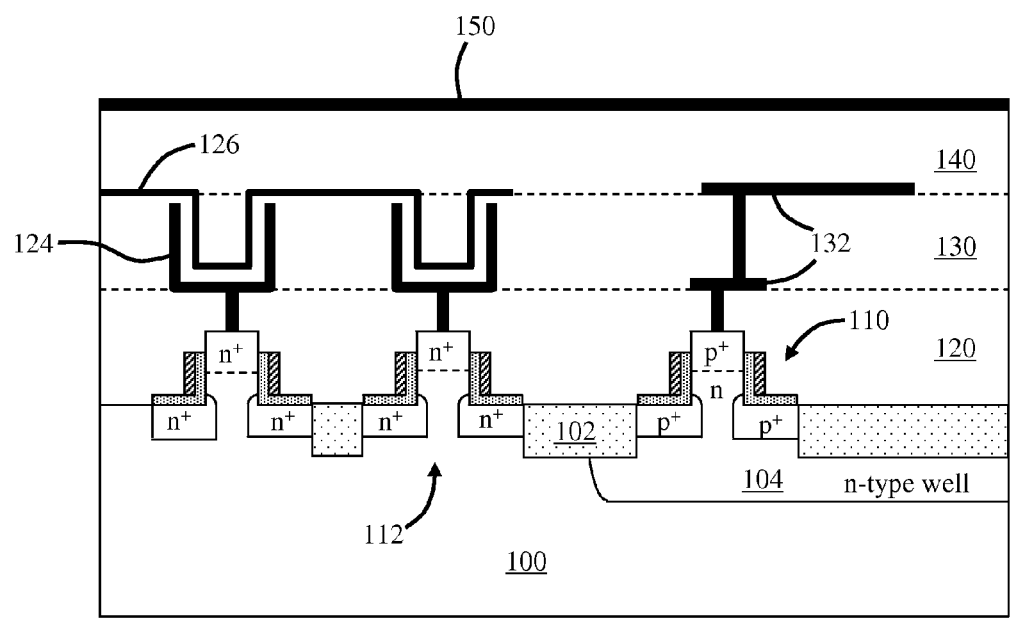

In FIG. 5, a third interlayer dielectric film 140 is formed and planarized to cover cell circuitry of the memory device on the first semiconductor substrate 100.

Multiple layers of interlayer dielectric films 120, 130, 140 are formed during the fabrication process, and those interlayer dielectric films can be formed with BSG (Boron Silicate Glass) film, PSG (PhosphoSilicate Glass) film, BPSG (Boro-PhosphoSilicate Glass) film, USG (Undoped Silicate Glass) film, TEOS (TetraEthylOrthoSilicate Glass) film, $O_3$-TEOS film or PE (Plasma Enhanced)-TEOS.

After forming the third interlayer dielectric film on the first semiconductor substrate 100, which is the upper most layer, a bonding layer 150 is formed on where a second semiconductor substrate 200 will be formed.

The bonding layer 150 can be formed with photo-setting adhesive such as reaction-setting adhesive, thermal-setting adhesive, photo-setting adhesive such as UV-setting adhesive, or anaerobe adhesive. Further, the bonding layer can be, such as, metallic bond (Ti, TiN, Al), epoxy, acrylate, or silicon adhesives.

The role of the bonding layer 150 is to increase bonding strength when bonding the second semiconductor substrate 200 on the bonding layer 150, as well as to decrease micro defects during the bonding.

Figure 6:
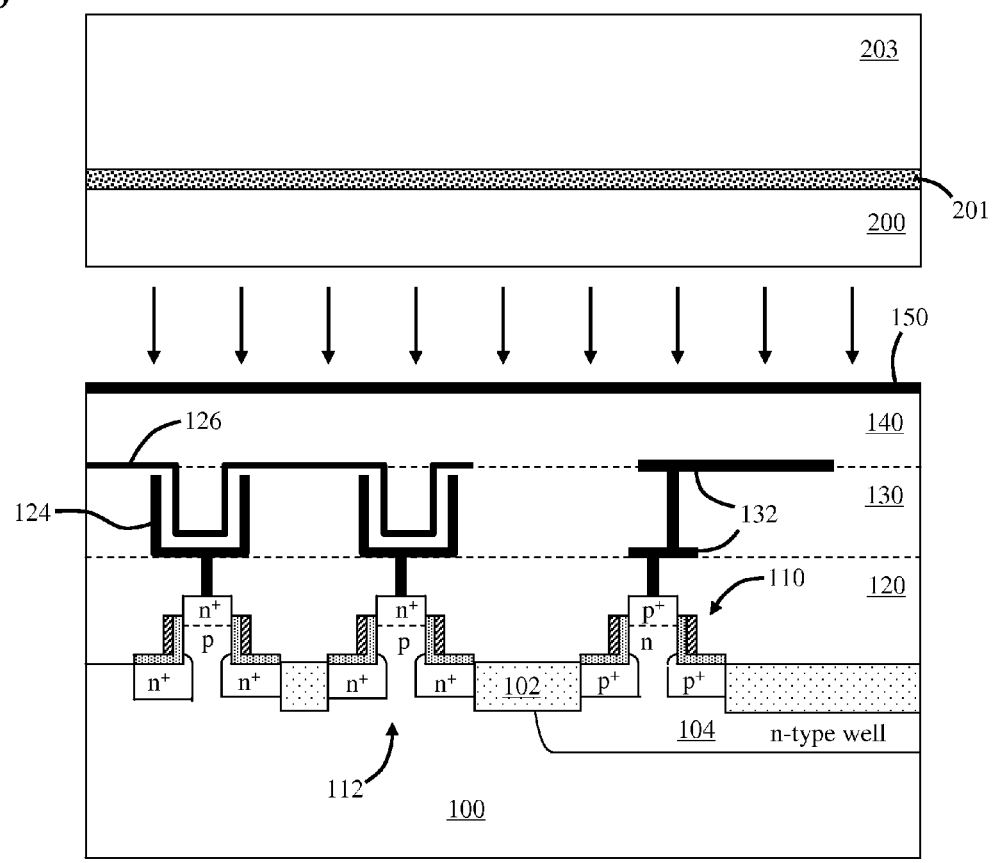

FIG. 6 is a sectional view of present invention and fabrication of the second semiconductor substrate 200 will be described with. The second semiconductor substrate 200 is bonded on the bonding layer 150.

A single crystalline semiconductor substrate 203 which has doped layers 200 is provided. The doped layer 200 has uniformly doped impurities in pre-defined depths. The doped layer 200 can be formed by ion implant the dopants to the single crystalline silicon substrate 203 or by adding dopants during epitaxial growth process for forming the single crystalline semiconductor substrate 203.

A detaching layer 201 is formed at pre-defined depth in the single crystalline semiconductor substrate to be contacted to the doped layers 200.

The detaching layer 201, in this embodiment of present invention, can be; porous layer in which micro holes are formed, insulating film such as oxide or nitride, organic bonding layer, or strained layer formed by different crystal lattice of two substrate (for example, Si—Ge).

In prior art, a exfoliating implant method using gases such as hydrogen was utilized to form the detaching layer. This method has a disadvantage that heavy ion-implantation can cause destroy of crystal lattice structure of the doped layer 200. In order to recover this crystal lattice structure, a thermal treatment at a very high temperature and long time should be performed but such treatment easily destroys cell devices in the lower region of the semiconductor device.

It should be noted that the detaching layer 201 in present invention refers to, not be formed by exfoliating implant method using gases but, as described, be formed by porous layer in which micro holes are formed, insulating film such as oxide or nitride, organic bonding layer, or strained layer formed by different crystal lattice of two substrates (for example, Si—Ge).

The detaching layer 201 can be used to prevent the doped layer 200 be removed when removing the single crystalline semiconductor substrate 200 after bonding. Also, the detaching layer 201 can detach the doped layer 200 easy and precisely from the single crystalline semiconductor substrate 203.

As a following step, the surface of the doped layer 200 is bonded to the bonding layer 150. The bonding process can be done in a pre-defined pressure and temperature to increase bonding strength.

When bonding the single crystalline semiconductor substrate 203 including the doped layer 200 on the first semiconductor substrate 100 including cell circuitry, because there is no pattern formed on the single crystalline semiconductor substrate 203 so that there is no requirement for fine alignment between the single crystalline semiconductor substrate 203 and the bonding layer 150.

After bonding the single crystalline semiconductor substrate 203 to the doped layer 200, remaining parts of the single crystalline semiconductor substrate 203 are removed only except the doped layer 200. As a result, the doped layer 200 becomes a new semiconductor substrate including doped layers.

In further details, after bonding, the single crystalline semiconductor substrate 203 is grinded or polished until the detaching layer 201 is exposed. After the detaching layer 201 is exposed, isotropic or anisotropic etch can be performed until the doped layer 200 is exposed. Because dopant concentration is different between doped layer 200 and detaching layer 201, a selective etch of the semiconductor substrate is available. Another method will be detach the single crystalline semiconductor substrate 203 and doped layer 200 by applying physical shock to the detaching layer 201 to produce a crack along the detaching layer 201 in where the crystal lattice structure is relatively weak.

The single crystalline semiconductor substrate 203 can be provided with glass wafer in other embodiment. For example, the doped layer 200 can be provided to the glass wafer, and then the doped layer can be transferred to another semiconductor substrate.

Figure 7:
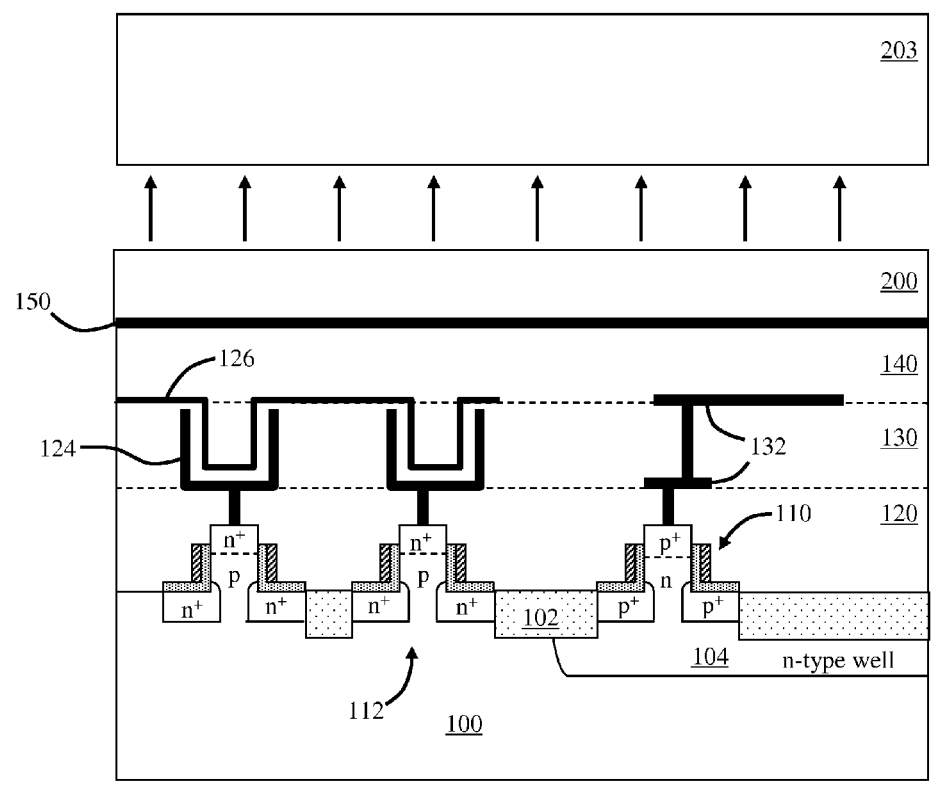

By performing described process steps, the second semiconductor substrate 200 can be provided of 0.1 um to 10 um thickness. The semiconductor substrate 200 is completely bonded to the bonding layer 150 and has a uniformly planarized surface as illustrated in FIG. 7. Logic circuitry 20 of the semiconductor device will be formed on the second semiconductor substrate.

Figure 8:
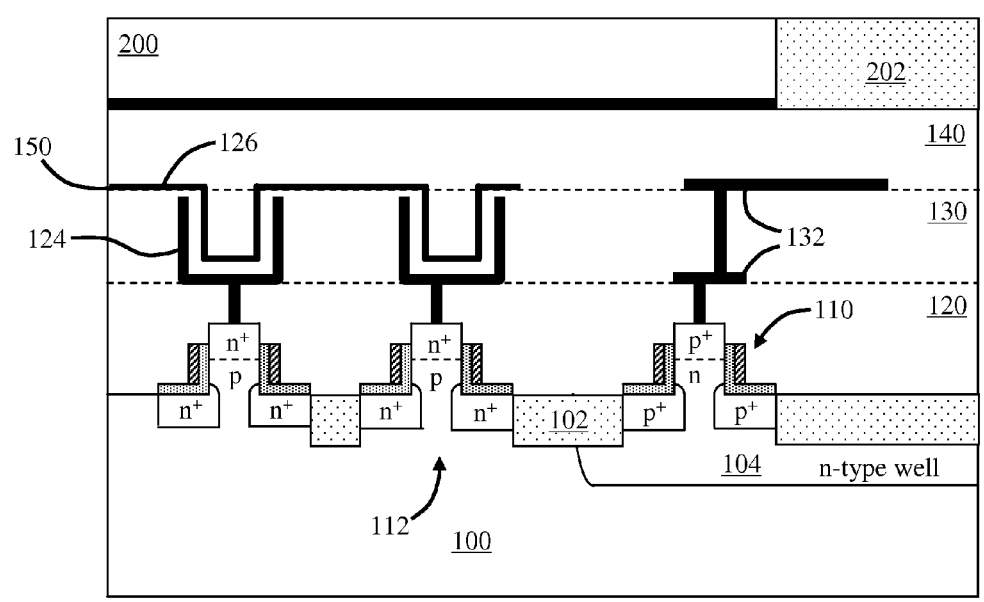

As illustrated in FIG. 8, an insulation film 202 is formed in the second semiconductor substrate 200. The location of the insulation film 202 is on the interconnects 132 of the cell circuitry in the lower substrate. The part of the second semiconductor substrate 200 and part of the bonding layer 150 is removed, and then insulation material is filled into the removed area so that insulation film 202 is formed to cover the cell circuitry.

Figure 9:
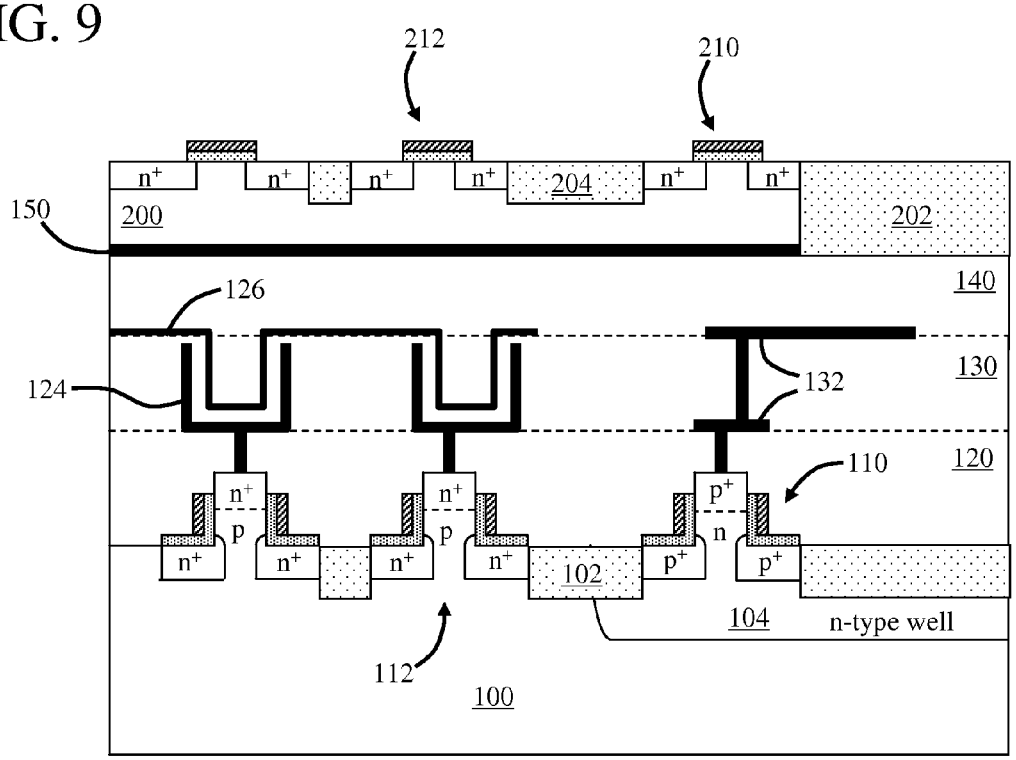

In FIG. 9, a device isolation film 204 is formed in the second semiconductor substrate 200 to define active region, excluding the region where the insulation film 202 is formed. The formation of isolation film 204 can be done by STI process as previously explained.

As a following step, transistors are formed on the second semiconductor substrate 200. These transistors form a logic circuitry of the semiconductor memory device. The transistors can be formed by conventional NMOS and/or PMOS fabrications process so that gate conductors 210 on the second semiconductor substrate 200 and source/drain region 212 at each side of the gate conductor 210 in the second semiconductor substrate 200 can be formed.

In this embodiment of the present invention, the fabrication process of the transistors may include high temperature process such as ion implantation and anneal, the affection of the high temperature to the interconnects 132 under the second semiconductor substrate 200 can be minimized, and this is a clear advantage of this invention.

Figure 10:
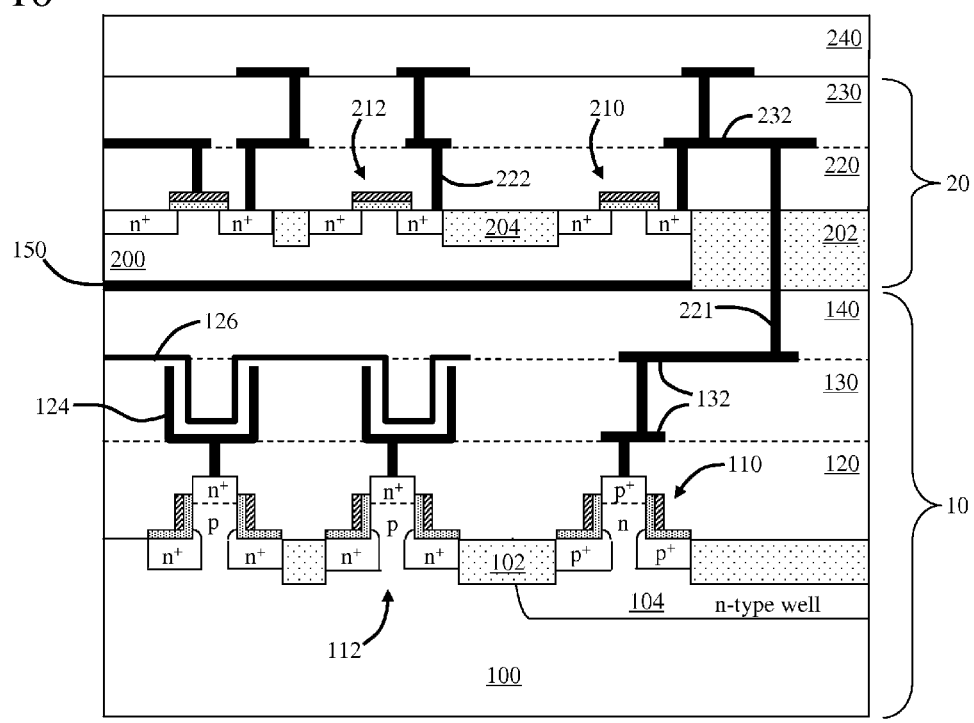

As illustrated in FIG. 10, next step is forming a fourth interlayer dielectric film 220 which covers transistors on the second semiconductor substrate 200.

The fourth interlayer dielectric film 220 can be formed, same as the first to the third interlayer dielectric films 120, 130, 140, with BSG (BoroSilicate Glass) film, PSG (PhosphoSilicate Glass) film, BPSG (BoroPhosphoSilicate Glass) film, USG (Undoped Silicate Glass) film, TEOS (TetraEthylOrthoSilicate Glass) film, O3-TEOS film or PE (Plasma Enhanced)-TEOS.

After this, a contact hole is formed by anisotropically etching through the fourth interlayer dielectric film 220, the insulation 202, and the third interlayer dielectric film 140, to expose interconnects 132 of the lower cell circuitry 10. The contact hole is filled in with conductive material to form a interconnect 221 which electrically connect the cell circuitry 10 in the lower part and the logic circuitry 20 in the upper part. The interconnect 221 can be formed with refractory metal such as Tungsten (W), Titanium (Ti), Molybdenum (Mo) or Tantalum (Ta).

Simultaneously, contacts 222 are formed in the dielectric film 220 in the region where the insulation film 202 is not formed, so that the contacts 222 are electrically connected to the transistors on the second semiconductor substrate 200.

After forming the contacts 222 and interconnect 221 in the fourth interlayer dielectric film 220, interconnects 232 is formed so that the interconnects 232 selectively connected to the contacts 222 and connect interconnect 221 in the fourth and fifth interlayer dielectric film 220, 230.

Through the fabrication process described above, a logic circuitry 20 can be completed. The logic circuitry 20 performs to control data stored in the memory circuitry in the lower part. After forming the logic circuitry 20, finally a insulation material is deposited to form a sixth interlayer dielectric film 240.

As described in this embodiment of the present invention, when forming a DRAM device with the cell circuitry 10 and the logic circuitry 20, the cell circuitry 10 and logic circuitry 20 can be arranged vertically in 3D structure, not using 2D plain arrangement, it becomes possible to get smaller size of the semiconductor device. In addition to this, by forming the transistors in the lower substrate to be vertically oriented, more semiconductor device chips can be produced out of a unit sized semiconductor substrate.

Also, the cell circuitry 10 in the lower substrate can be protected from the affection of the high process temperature, because the interconnects 132 and interconnects 221 are formed with refractory metal.

Another advantage of the present invention is that because there is no pattern formed on the second semiconductor substrate 200 when bonding the second semiconductor substrate 200 to the bonding layer 150, there is no need for fine alignment for bonding and this allows simpler fabrication process as an advantage.

Some of the steps of manufacturing SRAM circuit 100 include steps of providing a structure, such as a substrate, interconnect region, etc., and it should be noted that the structure can be provided in many different ways. For example, in some situations, a user provides the structure by manufacturing it and, in other situations, the user provides the structure by acquiring it, such as from a manufacturer. Some of the steps include steps of forming a structure, such as a substrate, interconnect region, conductive line, transistor, etc., and it should be noted that the structure can be formed in many different ways. For example, in some situations, the structure is formed by the user and, in other situations, the structure is formed by someone else and then provided to the user. The structures can be formed in many different ways, such as by growth, deposition, etc. Steps in forming the structures an include steps of etching, as well as some of the steps mentioned below.

The embodiments of the invention described herein are exemplary and numerous modifications, variations and rearrangements can be readily envisioned to achieve substantially equivalent results, all of which are intended to be embraced within the spirit and scope of the invention.

The invention claim is:

1. A method of forming a bonded semiconductor structure circuit, comprising:
   providing a support substrate which carries a first semiconductor circuit;
   providing a first interconnect region carried by the support substrate, the first interconnect region including a conductive line connected to the first semiconductor circuit, wherein the conductive line includes a refractory metal;
   providing a first bonded semiconductor substrate which is bonded to the first interconnect region through a first bonding interface;
   forming a second semiconductor circuit which is carried by the first bonded semiconductor substrate;
   forming a dielectric layer which is adjacent to a first sidewall of the first bonded semiconductor substrate;
   forming a conductive line which extends through the dielectric layer; and
   providing a second interconnect region which is carried by the first bonded semiconductor substrate, wherein the second interconnect region is connected to the second semiconductor circuit;
   wherein the first and second semiconductor circuits are connected together through the first and second interconnect regions and the conductive line extending through the dielectric layer.

2. The method of claim 1, wherein the first and second semiconductor circuits operate as volatile and non-volatile memory circuits, respectively.

3. The method of claim 1, wherein the first and second semiconductor circuits operate as a memory circuit and control circuit, respectively.

4. The method of claim 1, wherein the first semiconductor circuit includes a vertically oriented semiconductor device and the second semiconductor circuit includes a horizontally oriented semiconductor device.

5. The method of claim 1, wherein the vertically oriented semiconductor device operates as a memory device and the second semiconductor circuit controls the operation of the vertically oriented semiconductor device.

6. The method of claim 4, wherein the vertically oriented semiconductor device includes a layer structure which includes an oxide layer which extends between a silicon layer and a nitride layer.

7. The method of claim 1, wherein the first bonded semiconductor includes crystalline semiconductor material.

8. The method of claim 1, further including providing a second bonded semiconductor substrate which is bonded to the second interconnect region through a second bonding interface.

9. A method of forming a bonded semiconductor structure circuit, comprising:
   providing a support substrate;
   forming a vertically oriented semiconductor device which is carried by the support substrate;
   forming a first interconnect region which is carried by the support substrate and includes a conductive line connected to the vertically oriented semiconductor device;
   coupling a first bonded substrate to the first interconnect region through a bonding layer and bonding interface;
   forming a first dielectric layer which extends along a sidewall of the first bonded substrate;
   forming a conductive line which extends through the first dielectric layer and is connected to the first interconnect region;
   forming a first electronic circuit which is carried by the first bonded substrate;
   forming a second interconnect region which is carried by the first bonded substrate and connected to the first electronic circuit and the conductive line extending through the first dielectric layer.

10. The method of claim 9, wherein the vertically oriented semiconductor device includes a mesa structure having a stack of semiconductor layers, and a control dielectric region extending annularly around the stack of semiconductor layers.

11. The method of claim 10, wherein the control dielectric region includes an oxide layer and a nitride layer.

12. The method of claim 9, wherein the vertically oriented semiconductor device operates as a memory device and the first semiconductor circuit controls the operation of the vertically oriented semiconductor device.

13. The method of claim 9, wherein the first bonded semiconductor includes crystalline semiconductor material.

14. The method of claim 9, further including providing a second bonded semiconductor substrate which is bonded to the second interconnect region through a second bonding interface.

15. The method of claim 14, further including forming a second dielectric layer which extends along a sidewall of the second bonded substrate.

16. The method of claim 15, further including forming a conductive line which extends through the second dielectric layer and is connected to the second interconnect region.

17. The method of claim 16, further including forming a second electronic circuit which is carried by the second bonded substrate.

18. The method of claim 17, further including forming a third interconnect region which is carried by the second bonded substrate and is connected to the second electronic circuit and the conductive line extending through the second dielectric layer.

19. The method of claim 9, wherein the vertically oriented semiconductor device includes a dual gate.

* * * * *